(12) United States Patent
Koike

(10) Patent No.: US 6,531,736 B1
(45) Date of Patent: Mar. 11, 2003

(54) SEMICONDUCTOR DEVICE AND METHOD OF MANUFACTURING THEREOF

(75) Inventor: Hidetoshi Koike, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/469,367

(22) Filed: Dec. 22, 1999

Related U.S. Application Data

(62) Division of application No. 09/179,307, filed on Oct. 27, 1998, now Pat. No. 6,030,876.

(30) Foreign Application Priority Data

Oct. 29, 1997 (JP) .............................................. 9-297119

(51) Int. Cl.⁷ .............................................. H01L 29/76
(52) U.S. Cl. ........................ 257/335; 257/336; 257/344; 257/327
(58) Field of Search ................................. 257/335, 336, 257/344, 327; 438/229, 230, 231, 299, 301, 303, 305, 306

(56) References Cited

U.S. PATENT DOCUMENTS

| | | | |
|---|---|---|---|
| 4,519,051 A | 5/1985 | Fuji .............................. 257/324 |
| 5,158,903 A | 10/1992 | Hori et al. .................... 438/302 |
| 5,214,305 A | 5/1993 | Huang et al. ................. 257/413 |
| 5,356,834 A | 10/1994 | Sugimoto et al. |
| 5,409,853 A | 4/1995 | Yu |
| 5,489,543 A | 2/1996 | Hong .......................... 438/291 |
| 5,545,578 A | 8/1996 | Park et al. ................... 438/595 |
| 5,616,961 A | 4/1997 | Kohyama .................... 257/758 |
| 5,635,746 A | 6/1997 | Kimura et al. .............. 257/412 |
| 5,646,284 A | 7/1997 | Kusonoki et al. ........... 438/286 |
| 5,656,519 A | 8/1997 | Mogami |
| 5,693,550 A | 12/1997 | Torii |
| 5,716,862 A | 2/1998 | Ahmad et al. |
| 5,719,410 A * | 2/1998 | Suehiro et al. ............. 257/750 |
| 5,721,175 A * | 2/1998 | Kunishima et al. ......... 438/542 |
| 5,723,377 A * | 3/1998 | Torii ........................... 438/303 |
| 5,726,479 A | 3/1998 | Matsumoto et al. ........ 257/344 |
| 5,731,242 A | 3/1998 | Parat et al. .................. 438/586 |
| 5,736,442 A | 4/1998 | Mori |
| 5,739,573 A | 4/1998 | Kawaguchi .................. 257/384 |
| 5,759,889 A | 6/1998 | Sakao .......................... 438/241 |
| 5,766,996 A * | 6/1998 | Hayakawa et al. ......... 438/257 |
| 5,767,530 A | 6/1998 | Ha ................................ 257/72 |
| 5,767,554 A | 6/1998 | Ikeda et al. ................. 257/393 |
| 5,776,822 A | 7/1998 | Fuji et al. .................... 438/586 |
| 5,783,475 A | 7/1998 | Ramaswami ................ 438/303 |
| 5,818,085 A | 10/1998 | Hsu et al. .................... 257/347 |
| 5,851,890 A | 12/1998 | Tsai et al. |
| 5,874,330 A | 2/1999 | Ahn |
| 5,882,973 A | 3/1999 | Gardner et al. |
| 5,897,365 A | 4/1999 | Matsubara .................. 438/592 |
| 5,955,761 A * | 9/1999 | Yoshitomi et al. .......... 257/336 |

* cited by examiner

*Primary Examiner*—Kevin M. Picardat
(74) *Attorney, Agent, or Firm*—Banner & Witcoff, Ltd.

(57) ABSTRACT

In the manufacture of a semiconductor device having a logic section and a memory section built in the same chip, a thin layer of refractory metal (titanium: Ti) is deposited by sputtering in the logic section with the entire memory section covered with a layer of silicon nitride and, when heated subsequently, a layer of silicide (titanium disilicide: $TiS_2$) is formed. Unreacted metal is then removed by means of a wet process, allowing silicide to be formed selectively. In this case, since silicide is not formed on silicon nitride nor silicon oxide, no silicide is formed on diffused layers (source/drain regions of MOSFETs) in the memory section covered with the silicon nitride layer.

16 Claims, 11 Drawing Sheets

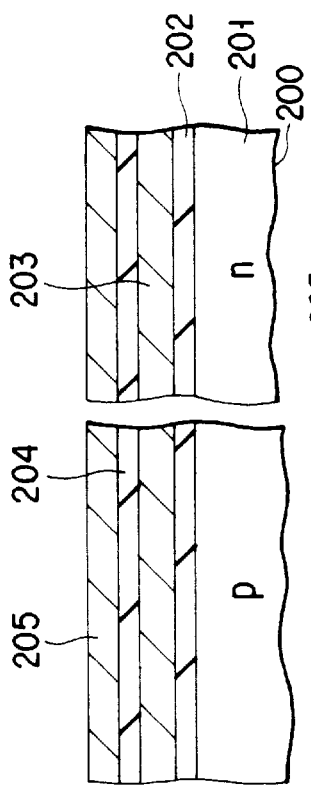
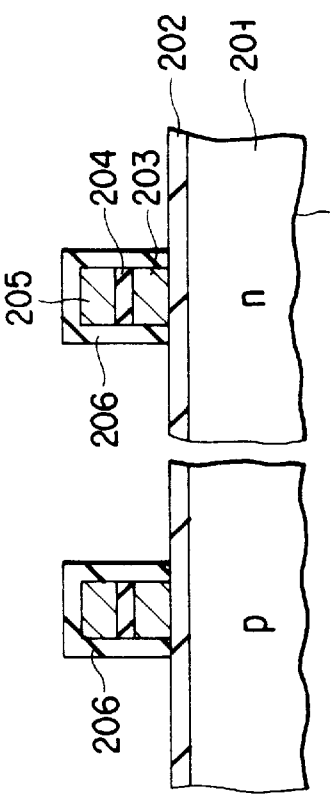
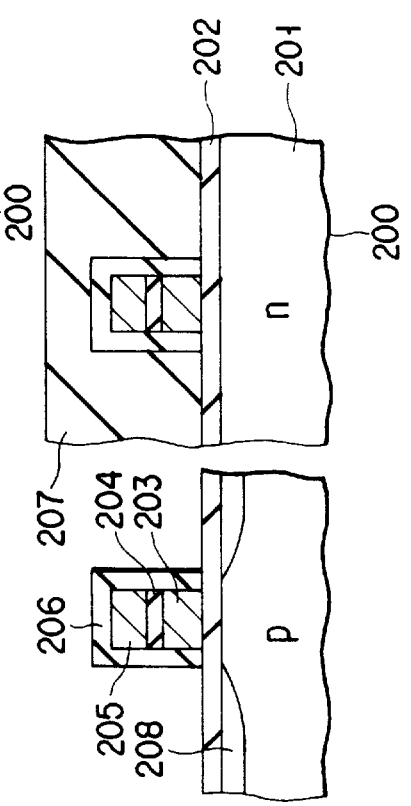
FIG. 7A
FIG. 7B
FIG. 7C
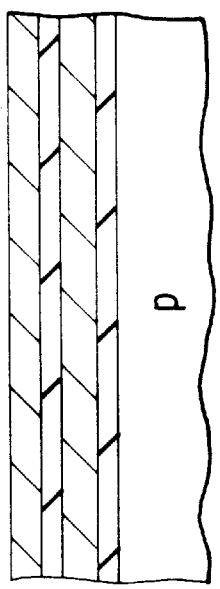
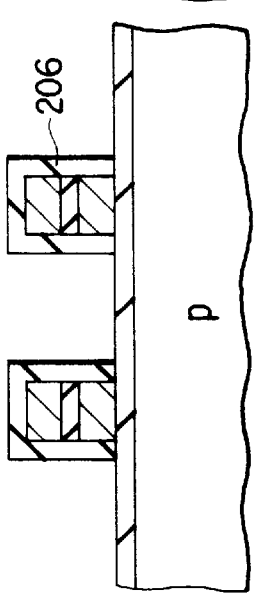
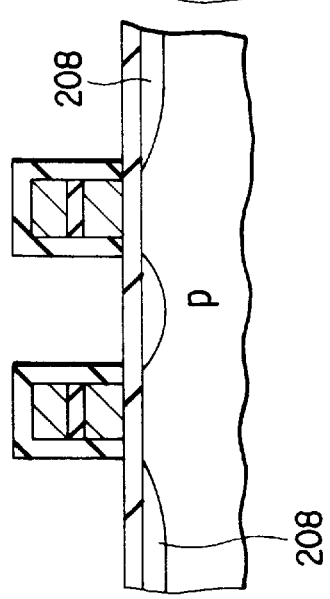

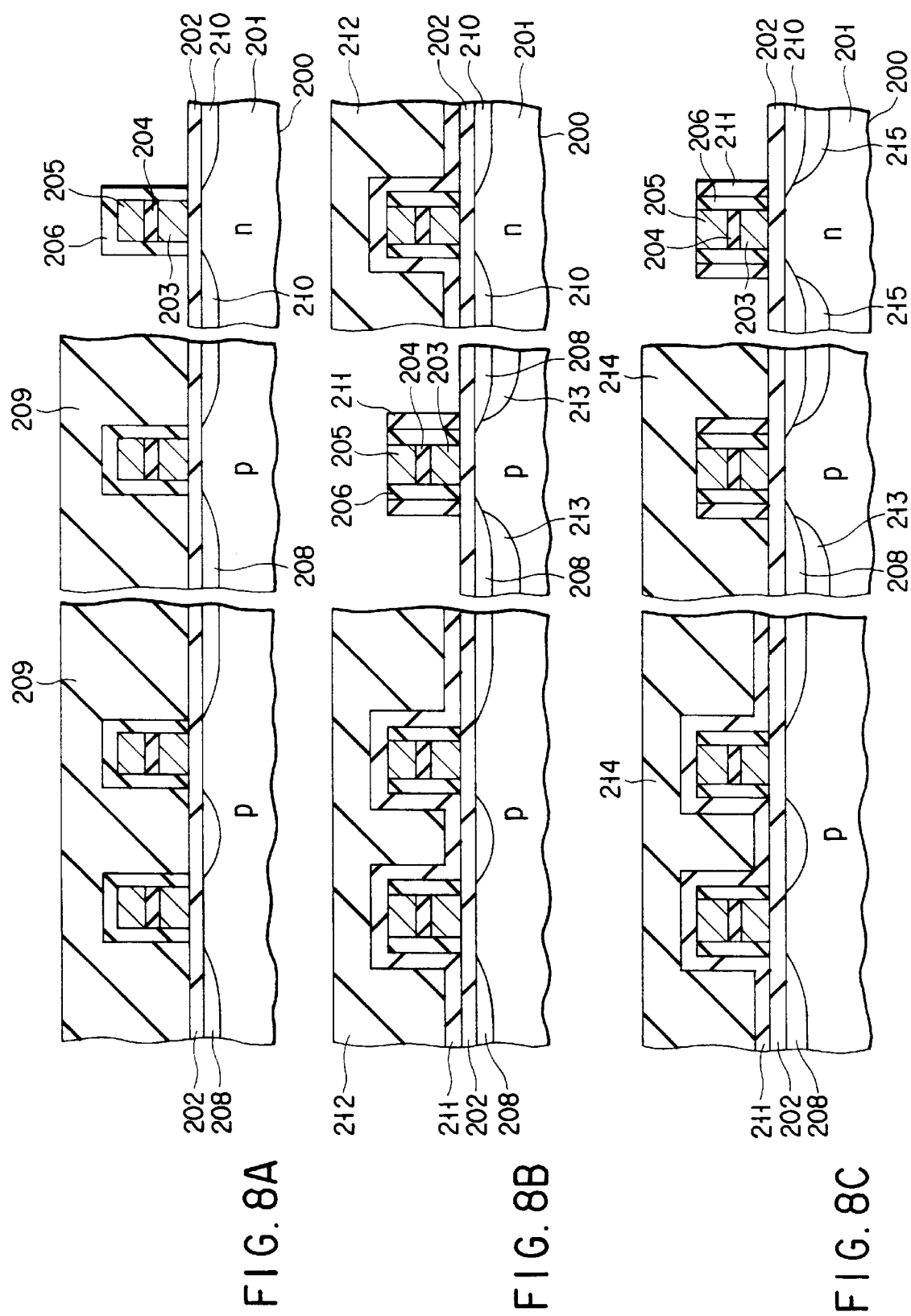

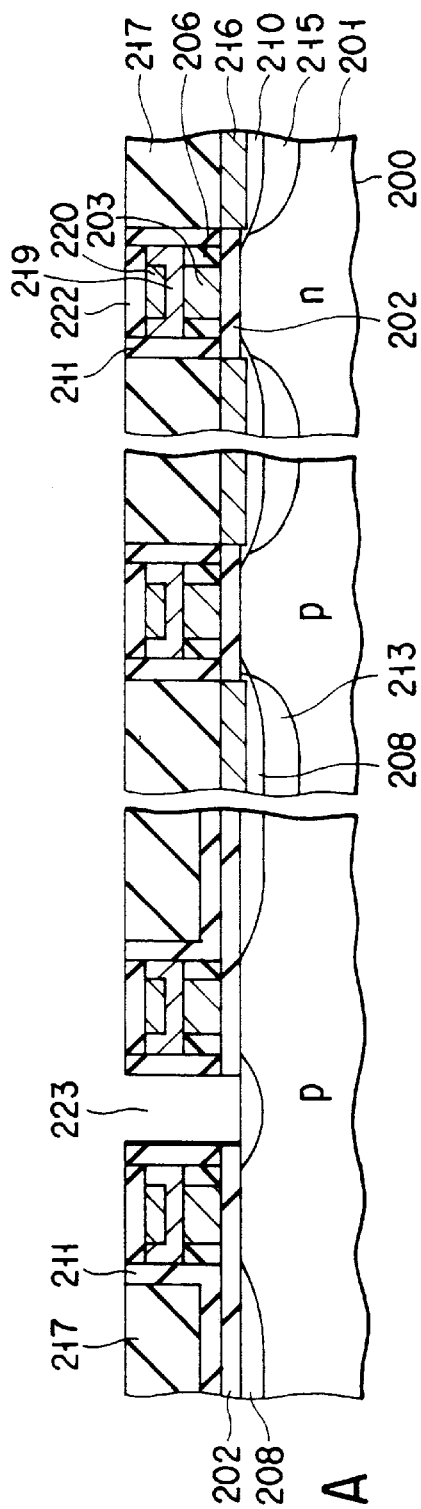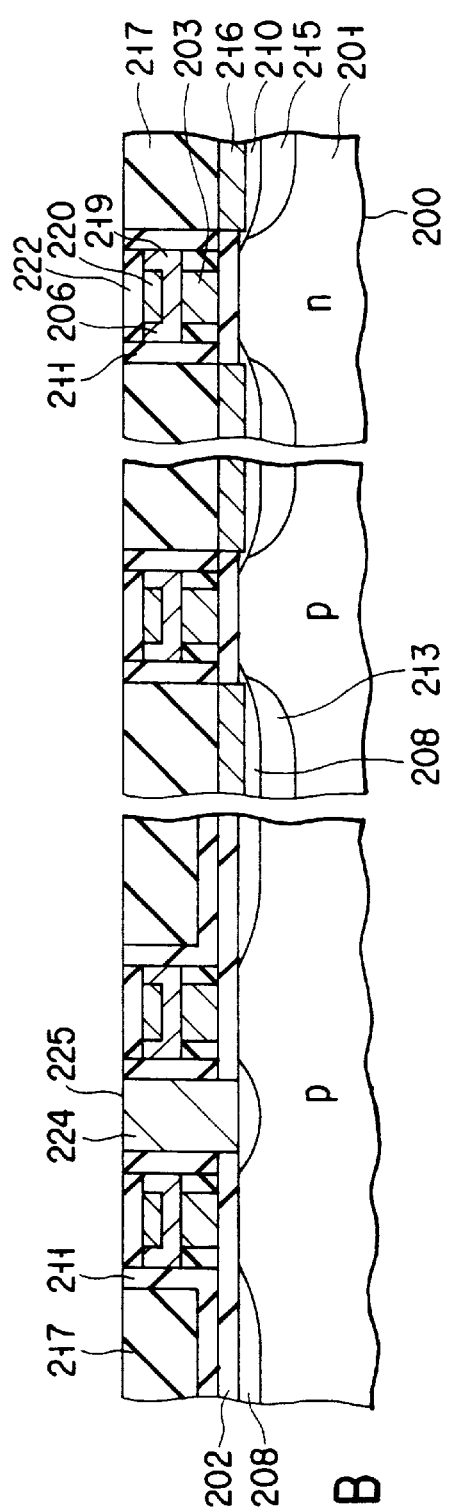
FIG. 11A
FIG. 11B

SEMICONDUCTOR DEVICE AND METHOD OF MANUFACTURING THEREOF

This application is a Divisional of U.S. application Ser. No. 09/179,307, filed on Oct. 27, 1998 now U.S. Pat. No. 6,030,076.

BACKGROUND OF THE INVENTION

The present invention relates to a semiconductor device and a method of manufacture thereof, and more particularly to a semiconductor device including MISFETs (Metal-Insulator-Semiconductor Field Effect Transistors) and a method of manufacture thereof.

A conventional method of manufacturing MISFETs having metal gate electrodes will be described with reference to FIGS. 1A, 1B, and 1C.

First, as shown in FIG. 1A, a gate oxide layer 312 is formed on a p-type semiconductor substrate 311. Next, a polysilicon layer 313, a barrier metal layer 314 for suppressing the reaction of polysilicon and tungsten (W), and a metal layer 315 made of tungsten are deposited in sequence onto the gate oxide layer and then patterned using standard lithographic and RIE (Reactive Ion Etching) techniques to form gate electrodes. After that, p-type impurities are ion implanted into the substrate 311 using the gate electrodes as a mask to form source/drain diffusion layers 316 in the substrate.

Next, as shown in FIG. 1B, a silicon nitride layer 317 is deposited over the entire surface and then etched back by means of RIE techniques to leave a sidewall spacer of silicon nitride on the sidewall of the gate electrode.

Next, as shown in FIG. 1C, after the deposition of a silicon oxide layer 318 over the entire surface, the silicon oxide layer 318 is etched using a predetermined contact pattern to form contact holes 319.

Note here that, in this example, the contact hole adjacent to the gate electrode is not formed using a self-aligned process.

Recently, semiconductor devices having a logic section and a memory section built into the same chip are in increasing demand.

In general, the logic section requires high-performance MISFETs as compared with the memory section. To achieve high performance, it is required to lower the sheet resistance of the diffusion layers of each MISFET. This is realized by forming a layer of silicide such as $TiSi_2$ or $CoSi_2$.

In the memory section, the source/drain diffusion layers of the MISFETs are formed shallower than in the logic section. Thus, if a layer of silicide were formed on the diffusion layers of the MISFETs within the memory section, a spike would be produced at the bottom of the silicide layer. This would increase the possibility of being shorted to the substrate, resulting in an increase in junction leakage in the source/drain diffusion layers. It is therefore not desirable to form the layer of silicide in the MISFETs in the memory section.

However, according to conventional methods of manufacturing a semiconductor device having a logic section and a memory section built in, the addition of a process of forming a layer of silicide on the source/drain diffusion layers results in a problem that silicide is formed on the diffusion layers of both the MISFETs in the logic section and the MISFETs in the memory section and thus a structure in which no layer of silicide is existent in the memory section cannot be attained.

BRIEF SUMMARY OF THE INVENTION

Accordingly, the present invention provides a semiconductor device which has, for example, a logic section and a memory section built into the same chip and permits the formation of such a structure that a layer of silicide is existent on the diffused regions of some MISFETs but nonexistent on the diffused regions of other MISFETs, thereby allowing the characteristics of the former MISFETs to be improved without degrading the characteristics of the latter MISFETs and a method of manufacture of such a semiconductor device.

The present invention also provides a semiconductor device having MISFETs which are low in gate resistance and small in gate-to-source/drain parasitic capacitance and a method of producing metal-gate MISFETs with good yield and high reliability.

According to one aspect of the present invention, there is provided a semiconductor device comprising: a semiconductor substrate; a gate insulating layer formed on the semiconductor substrate; a gate electrode formed on the gate insulating layer and including a lower electrode made of a first conductive layer and an upper electrode made of a second conductive layer lower in resistance than the first conductive layer; a first insulating layer selectively formed on a sidewall of the lower electrode of the gate electrode; a source/drain region including a diffused layer formed to self-align to the first insulating layer; and a layer of silicide formed on the source/drain region.

According to another aspect of the present invention, there is provided a semiconductor device comprising: a semiconductor substrate; a gate insulating layer formed on the semiconductor substrate; a gate electrode formed on the gate insulating layer; a. first insulating layer formed on a sidewall of the gate electrode; a second insulating layer formed on the first insulating layer; a source/drain region including a shallower diffused layer formed to self-align to the first insulating layer and a deeper diffused layer formed to self-align to the second insulating layer; and a layer of silicide formed on the source/drain region.

According to still another aspect of the present invention, there is provided a semiconductor device comprising: a semiconductor substrate; a gate insulating layer formed on the semiconductor substrate; a gate electrode formed on the gate insulating layer and including a lower electrode made of a first conductive layer and an upper electrode made of a second conductive layer lower in resistance than the first conductive layer; a first insulating layer selectively formed on a sidewall of the lower electrode of the gate electrode; a second insulating layer formed on a sidewall of the upper electrode and the first insulating layer covering the lower electrode of the gate electrode; a source/drain region including a shallower diffused layer formed to self-align to the first insulating layer and a deeper diffused layer formed to self-align to the second insulating layer; and a layer of silicide formed on the source/drain region.

According to still another aspect of the present invention, there is provided a semiconductor device comprising: a semiconductor substrate; a gate insulating layer formed on the semiconductor substrate; a gate electrode formed on the gate insulating layer and including a lower electrode made of a first conductive layer and an upper electrode made of a second conductive layer lower in resistance than the first conductive layer; a first insulating layer selectively formed on a sidewall of the lower electrode of the gate electrode; a second insulating layer formed on a sidewall of the upper electrode and the first insulating layer covering the lower electrode of the gate electrode; and first and second MISFETs formed in the semiconductor substrate and each having source/drain region, wherein the first MISFET has no silicide formed on its source/drain region and the second MISFET has silicide formed on its source/drain region.

According to still another aspect of the present invention, there is provided a semiconductor device comprising: a semiconductor substrate; a gate insulating layer formed on the semiconductor substrate; a gate electrode formed on the gate insulating layer; a first insulating layer formed on a sidewall of the gate electrode; a second insulating layer formed on the first insulating layer; and first, second and third MISFETs formed in the semiconductor substrate and each having source/drain region, wherein the first MISFET has no silicide formed on its source/drain region and the second and third MISFETs have silicide formed on their source/drain regions.

According to still another aspect of the present invention, there is provided a semiconductor device comprising: a semiconductor substrate; a gate insulating layer formed on the semiconductor substrate; a gate electrode formed on the gate insulating layer and including a lower electrode made of a first conductive layer and an upper electrode made of a second conductive layer lower in resistance than the first conductive layer; a first insulating layer selectively formed on a sidewall of the lower electrode of the gate electrode; a second insulating layer formed on a sidewall of the upper electrode and the first insulating layer covering the lower electrode of the gate electrode; first, second and third MISFETs formed in the semiconductor substrate and each having source/drain region, wherein the first MISFET has no silicide formed on its source/drain region and the second and third MISFETs have silicide formed on their source/drain regions.

According to still another aspect of the present invention, there is provided a method of manufacturing a semiconductor device comprising the steps of: forming a gate insulating layer on a semiconductor substrate; forming a first conductive layer on the gate insulating layer; forming a dummy layer above the first conductive layer; patterning the dummy layer and the first conductive layer to form a the gate electrode pattern; introducing first impurities into the semiconductor substrate using the gate electrode pattern as a mask to form a first diffused layer in the semiconductor substrate; forming a sidewall insulating layer as a spacer on the sidewall of the gate electrode; introducing second impurities of the same conductivity type as the first impurities into the semiconductor substrate using the sidewall insulating layer and the gate electrode pattern as a mask to form a second diffused layer deeper than the first diffused layer; forming a planarization insulating layer over an entire surface; etching back the planarization insulating layer until it reaches substantially the same level as the dummy layer in the gate electrode pattern to smooth out the entire surface; etching away the dummy layer to form a first recess between sidewall insulating layers; filling the first recess with a second conductive layer lower in resistance than the first conductive layer; etching a surface of the second conductive layer by a predetermined thickness to form a second recess between sidewall insulating layers; and filling the second recess with a cap insulating layer.

According to still another aspect of the present invention, there is provided a method of manufacturing a semiconductor device comprising the steps of: forming a gate insulating layer on a semiconductor substrate; forming a plurality of gate electrode patterns including a first conductive layer on the gate insulating layer; forming source/drain regions of first, second and third MISFETs into the semiconductor substrate; depositing an insulating layer over an entire surface; forming a sidewall insulating layer as a spacer on the sidewall of each of the gate electrode patterns in areas of the second and third MISFETs by selectively leaving the insulating layer on the sidewall of each of the gate electrode patterns in the areas of the second and third MISFETs with the insulating layer left over the entire surface in the area of the first MISFET; and selectively forming a layer of silicide on the source/drain regions of the second and third MISFETs.

According to still another aspect of the present invention, there is provided a method of manufacturing a semiconductor device comprising the steps of: forming a gate insulating layer on a semiconductor substrate; forming a plurality of gate electrode patterns including a first conductive layer on the gate insulating layer; forming first diffused layers of first and second MISFETs into the semiconductor substrate; forming second diffused layers of a third MISFET into the semiconductor substrate; depositing an insulating layer over an entire surface; forming a sidewall insulating layer as a spacer on a sidewall of each of the gate electrode patterns in areas of the second and third MISFETs by selectively leaving the insulating layer on the sidewall of each of the gate electrode patterns in the areas of the second and third MISFETs with the insulating layer left over the entire surface in the area of the first MISFET; forming third diffused layers deeper than the first diffused layers of the second MISFET to form source/drain regions of the second MISFET; forming fourth diffused layers deeper than the second diffused layers of the third MISFET to form source/drain regions of the third MISFET; and selectively forming a layer of silicide on the source/drain regions of the second and third MISFETs.

According to still another aspect of the present invention, there is provided a method of manufacturing a semiconductor device comprising the steps of: forming a gate insulating layer on a semiconductor substrate; forming a plurality of gate electrode patterns including a first conductive layer on the gate insulating layer; forming first diffused layers of first and second MISFETs into the semiconductor substrate; forming second diffused layers of a third MISFET into the semiconductor substrate; depositing an insulating layer over an entire surface; forming a sidewall insulating layer as a first spacer by selectively leaving the insulating layer on the sidewall of each of the gate electrode patterns in the areas of the second and third MISFETs with the insulating layer left over an entire surface in the area of the first MISFET; forming third diffused layers deeper than the first diffused layers of the second MISFET to form source/drain regions of the second MISFET; forming a sidewall insulating layer as a second spacer by selectively leaving the insulating layer on the sidewall of each of the gate electrode patterns in the areas of the second and third MISFETs with the insulating layer left over an entire surface in the area of the first MISFET; forming fourth diffused layers deeper than the second diffused layers of the third MISFET to form source/drain regions of the third MISFET; and selectively forming a layer of silicide on the source/drain regions of the second and third MISFETs.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention in which:

FIGS. 7A to 7C are sectional views, in the order of steps of manufacture, of a semiconductor device in accordance with a second embodiment of the present invention;

FIGS. 8A to 8C are sectional views of the semiconductor device in the order of manufacturing steps following the manufacturing steps in FIGS. 7A to 7C;

FIGS. 11A and 11B are sectional views of the semiconductor device in the order of manufacturing steps following the manufacturing steps in FIGS. 10A to 10C.

DETAILED DESCRIPTION OF THE INVENTION

Preferred embodiments of the present invention will now be described with reference to the accompanying drawings.

[First Embodiment]

FIGS. 2A to 2C, 3A to 3C, 4A to 4C, 5A to 5C, and 6A to 6C are sectional views, in the order of steps of manufacture, of a semiconductor device according to a first embodiment of the present invention.

The semiconductor device according to this embodiment has a logic section and a memory section built in. Further, in this embodiment there is shown a case where the memory section has only n-channel transistors (nMOSFETs) formed in, whereas the logic section has both n-channel and p-channel MOSFETs (hereinafter referred to as logic nMOSFETs and logic pMOSFETs, respectively) formed in.

Figure 1A:
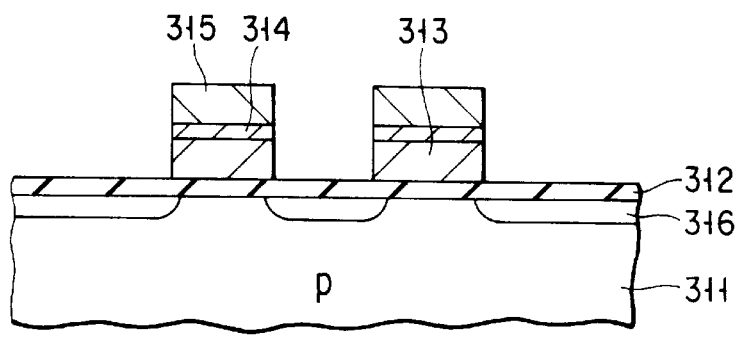
FIGS. 1A to 1C are sectional views, in the order of steps of manufacture, of a conventional semiconductor device.
Figure 1B:
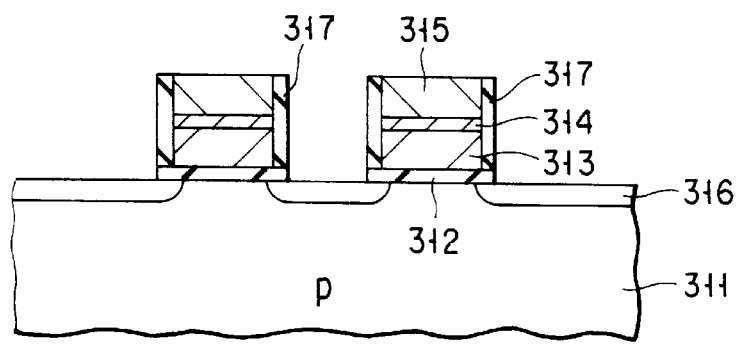
Figure 1C:
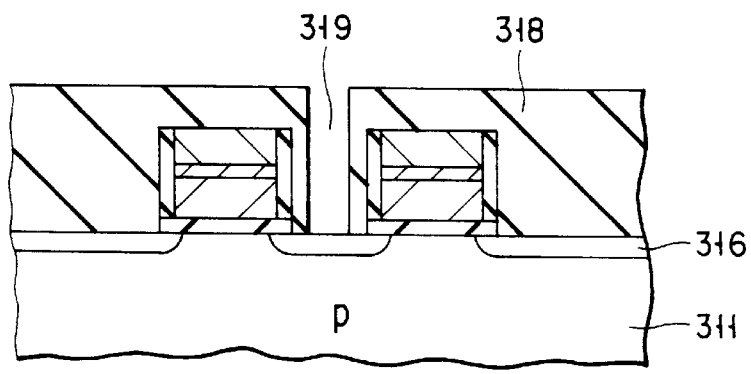
Figures 2A, 2B, 2C:
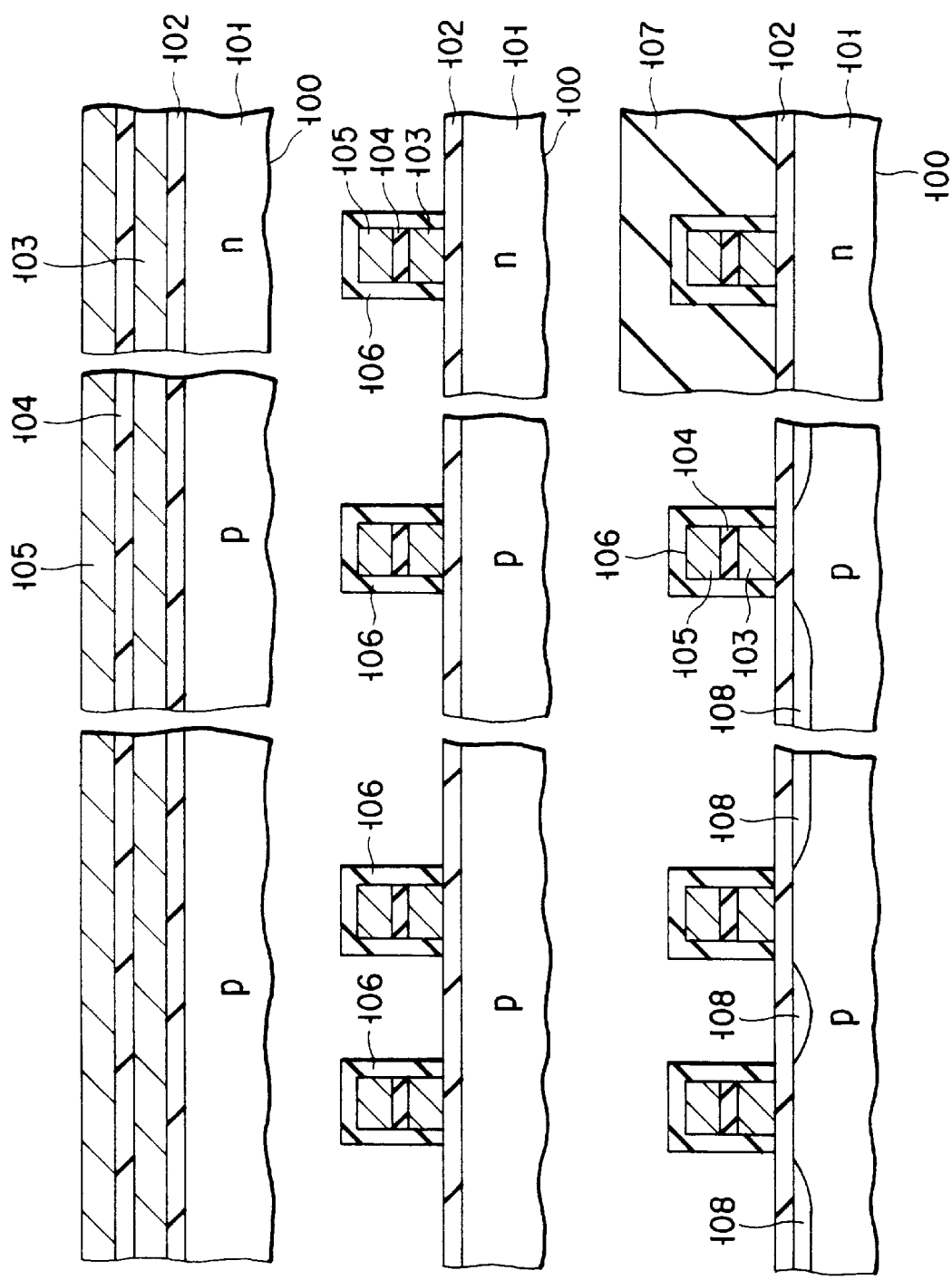
FIGS. 2A to 2C are sectional views, in the order of steps of manufacture, of a semiconductor device in accordance with a first embodiment of the present invention.

First, as shown in FIG. 2A, a gate oxide layer 102 is formed on a p-type silicon substrate 100 formed with an n-well region 101. Subsequently, an n-type impurity-doped polysilicon layer 103 is formed over the entire surface. The surface of the polysilicon layer is oxidized to form a silicon oxide layer 104. A polysilicon layer 105 is then deposited over the entire surface. The upper polysilicon layer 105 is used as a dummy layer.

Next, as shown in FIG. 2B, the resulting multi-layered structure on the gate oxide 102 is etched using conventional lithographic and RIE techniques into a pattern of gate electrode portions. After that, an oxidation operation is performed to recover from RIE-induced damage and a silicon oxide layer 106 is formed on the exposed surface of the gate electrode pattern.

Next, as shown in FIG. 2C, a resist layer 107 is formed on logic nMOSFETs (corresponding to the region in which the n-well 101 is formed). Using the resist layer 107 and the gate electrode pattern as a mask, n-type impurities, such as phosphorus (P) or arsenic (As), are ion implanted into the substrate 100 and then heat treatment is carried to form first n-type diffusion layers 108 of memory cells and logic nMOSFETS. At this point, the ion dose is in the range of from $1 \times 10^{14}$ to $5 \times 10^{14}$ cm$^{-2}$ and the acceleration voltage corresponds to an ion energy of 20 KeV.

Figures 3A, 3B, 3C:
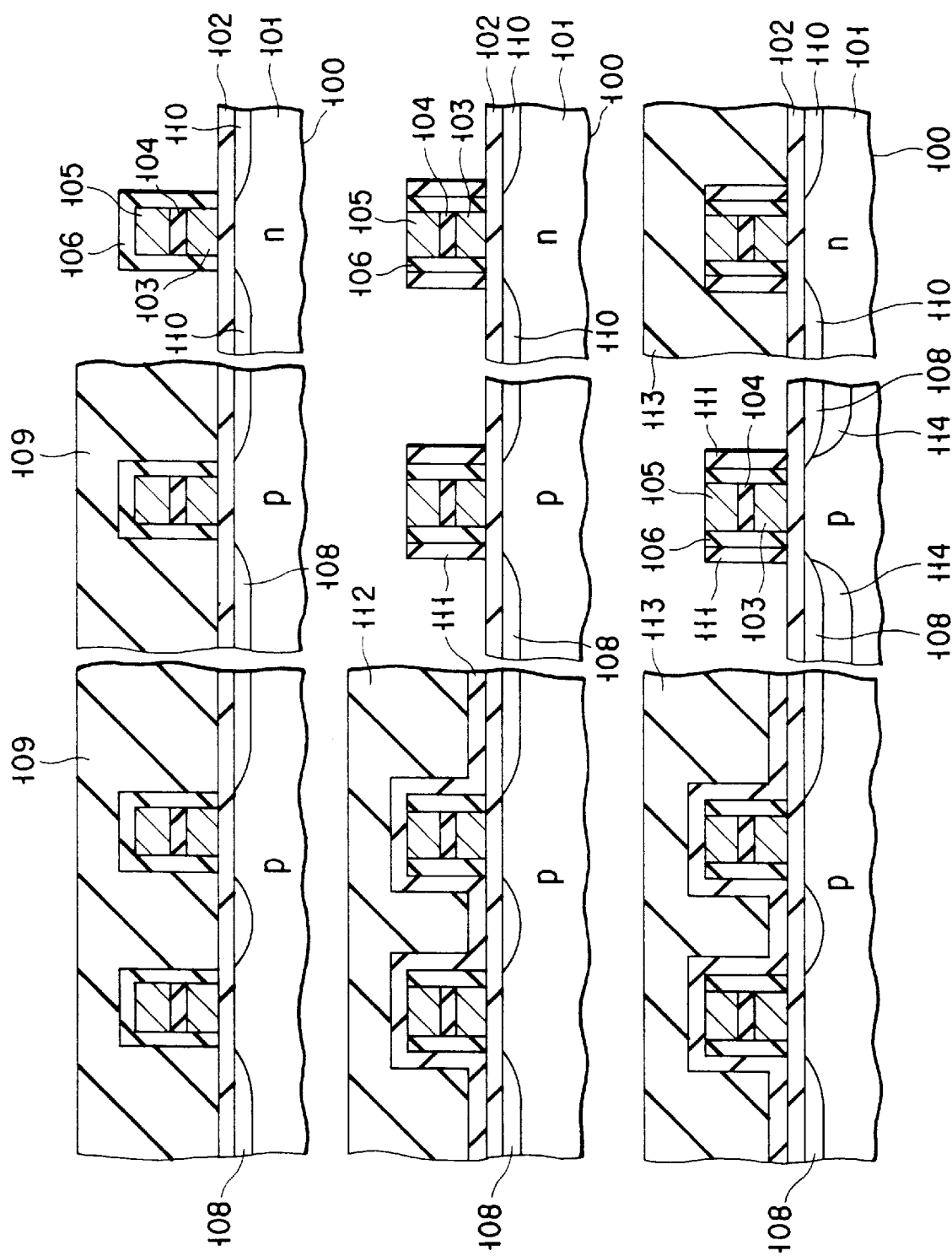
FIGS. 3A to 3C are sectional views of the semiconductor device in the order of manufacturing steps following the manufacturing steps in FIGS. 2A to 2C.

Next, as shown in FIG. 3A, a resist layer 109 is formed on memory cells and logic nMOSFETs. Using the resist layer 109 and the gate electrode pattern as a mask, p-type impurities, such as B or BF$_2$, are ion implanted into the n-well region 101 and then a thermal process is carried out to form first p-type diffused layers 110 of each logic pMOSFET.

Next, as shown in FIG. 3B, a silicon nitride layer 111 is deposited over the entire surface and a resist layer 112 is then formed on the memory cells. By using RIE techniques, etchback is performed to leave a sidewall spacer 111 consisting of silicon nitride on the sidewalls of the gate electrode portions of the logic nMOSFETs and the logic pMOSFETs.

Next, as shown in FIG. 3C, a resist layer 113 is formed over the memory cells and the logic pMOSFETs. By using the resist layer 113 and the gate electrode portions each formed with the sidewall spacer 111 consisting of silicon nitride, n-type impurities, such as P or As, are ion implanted into the substrate 100 and then a thermal process is carried to form second n-type diffused layers 114 which are deeper than the first n-type diffused layers 108 associated with the logic nMOSFETs. At this point, the ion dose is in the range of from $1 \times 10^{15}$ to $5 \times 10^{15}$ cm$^{-2}$ and the acceleration voltage corresponds to an ion energy in the range of from 30 to 40 KeV.

Figures 4A, 4B, 4C:
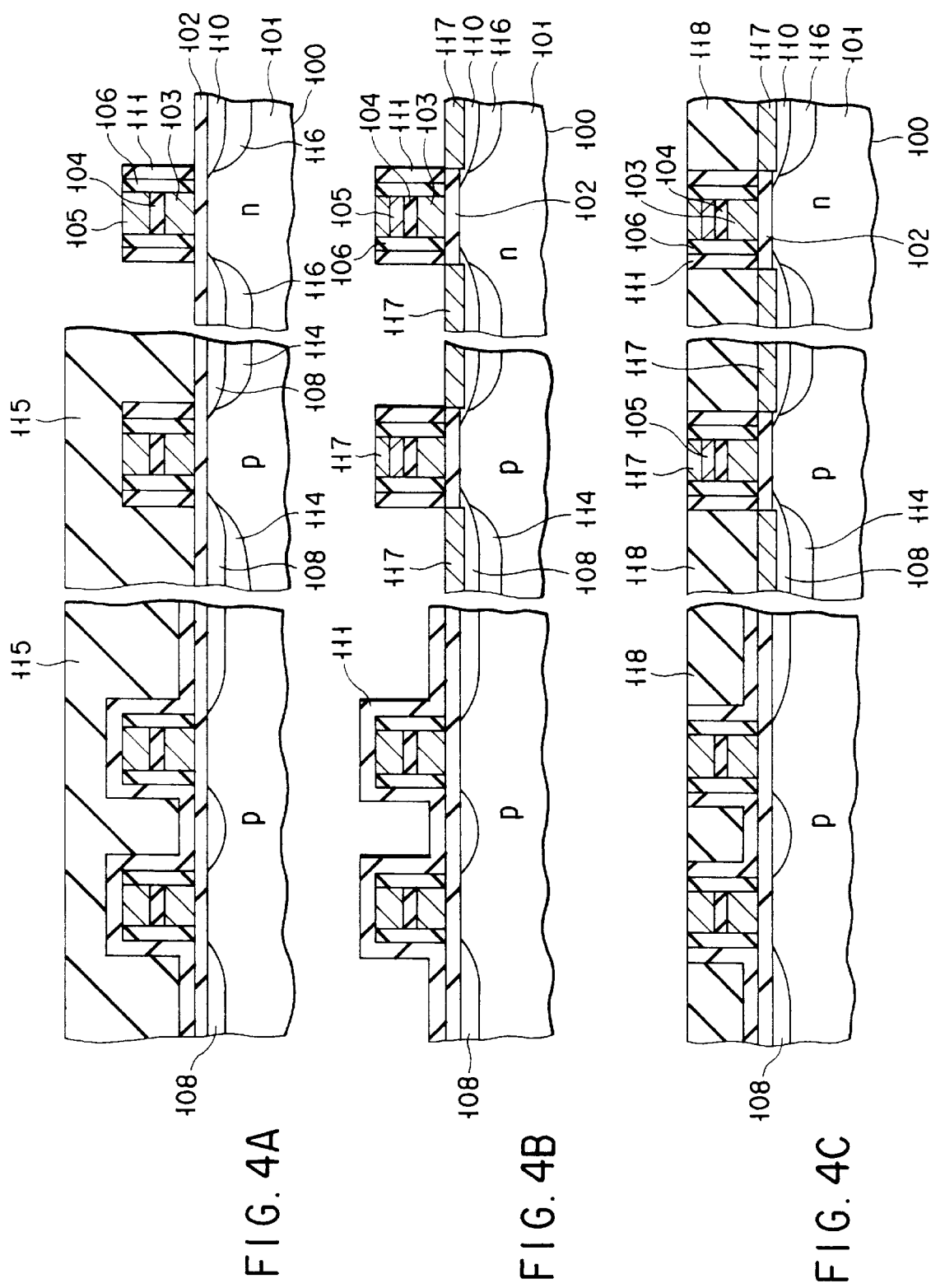
FIGS. 4A to 4C are sectional views of the semiconductor device in the order of manufacturing steps following the manufacturing steps in FIGS. 3A to 3C.

Next, as shown in FIG. 4A, a resist layer 115 is formed over the memory cells and the logic nMOSFETs. By using the resist layer 115 and the gate electrode pattern as a mask, p-type impurities, such as B or BF$_2$, are ion-implanted into the n-well region 101 to form second p-type diffused layers 116 which are deeper than the first p-type diffused layers 110 associated with the logic pMOSFETs. At this point, the dose of ions is in the range of $1 \times 10^{15}$ to $5 \times 10^{15}$ cm$^{-2}$ and the acceleration voltage corresponds to an ion energy of from 30 to 40 KeV. The first and second n-type diffused layers 108 and 114 form the source/drain regions of the logic nMOSFETs when the impurities are activated by the subsequent thermal process. Likewise, the first and second p-type diffused layers 110 and 116 form the source/drain regions of the logic pMOSFETs.

Next, as shown in FIG. 4B, after the removal of the resist layer 115 and the gate oxide layer 102, metal, such as titan (Ti), is deposited by means of sputtering and then a thermal process is carried out to allow the metal to react with the source/drain regions (the first n-type diffused layers 108 and the second n-type diffused layers 114) of the logic nMOSFETs, the source/drain regions (the first p-type diffused layers 110 and the second p-type diffused layers 116) of the logic pMOSFETs, and the polysilicon layer 105, thereby forming a TiS$_2$ layer. Subsequently, unreacted Ti is removed by a wet process to thereby selectively leave the titanium disilicide layer 117. At this point, silicide is not formed on the first n-type diffused layers 108 of the memory cells in the memory section having its entire surface covered with the silicon nitride layer 111; this is because silicide is not formed on silicon oxide nor silicon nitride.

Next, as shown in FIG. 4C, a silicon oxide layer 118 is deposited over the entire surface and then removed or polished by means of CMP (chemical mechanical polishing) until the gate electrode pattern is exposed, thereby providing planarization of the entire surface.

Figure 5A:
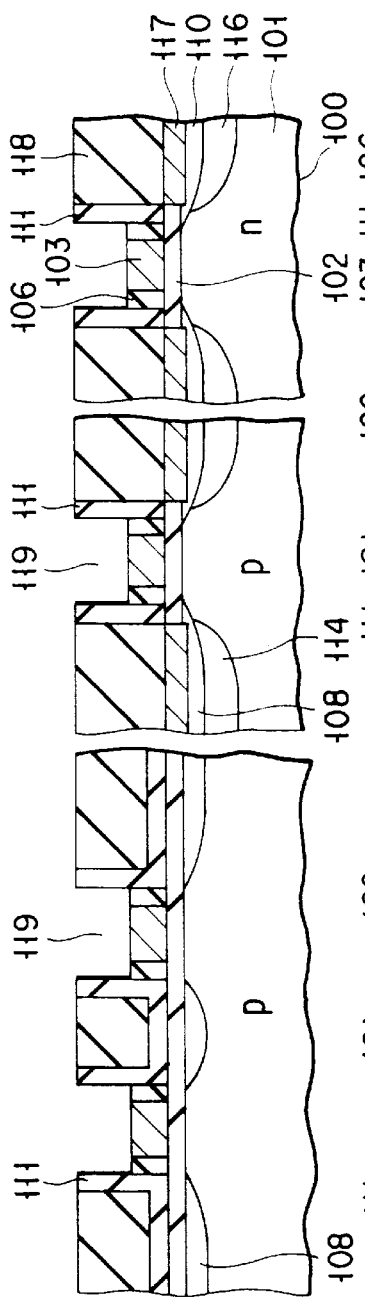
FIGS. 5A to 5C are sectional views of the semiconductor device in the order of manufacturing steps following the manufacturing steps in FIGS. 4A to 4C.

Next, as shown in FIG. 5A, the silicide layer 117 and the polysilicon layer 105 are etched away by means of RIE or CDE (chemical dry etching). Then, by means of a wet process using HF or the like, the silicon oxide layers 104 and 106 are etched to form recesses 119 in positions where the gate electrode portions are located as shown.

Figure 5B:
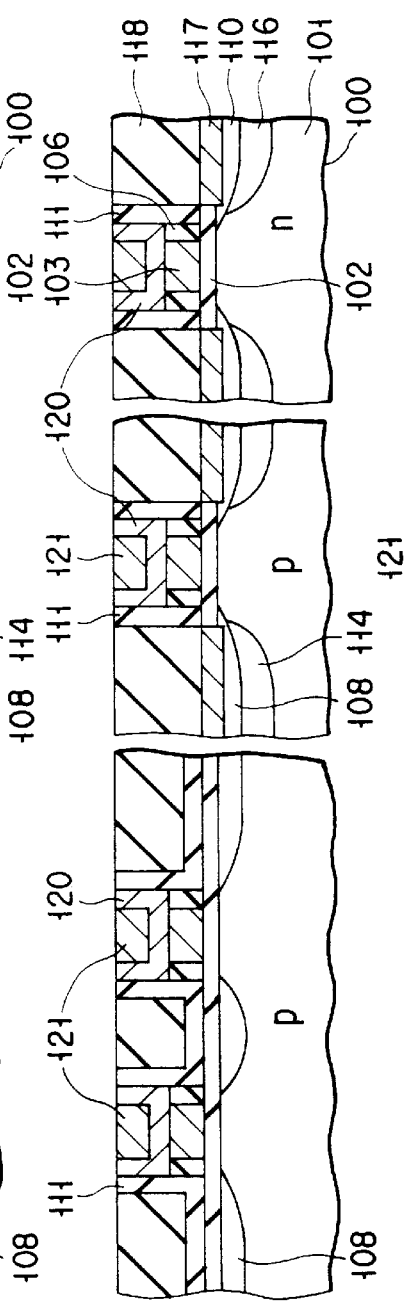

Next, as shown in FIG. 5B, metal, such as TiN or WN, is deposited by means of sputtering or CVD (chemical vapor deposition) over the entire surface to such a thickness as not to fill in the step 119, thereby forming a barrier metal layer 120. Subsequently, a metal layer 121, preferably a layer of refractory metal, such as tungsten (W), is deposited over the entire surface by means of sputtering or CVD to fill in the recess 119. By using CMP, the metal layer 121 and the barrier metal layer 120 are polished until the silicon oxide layer 118 is exposed, thereby providing surface planarization.

Figure 5C:
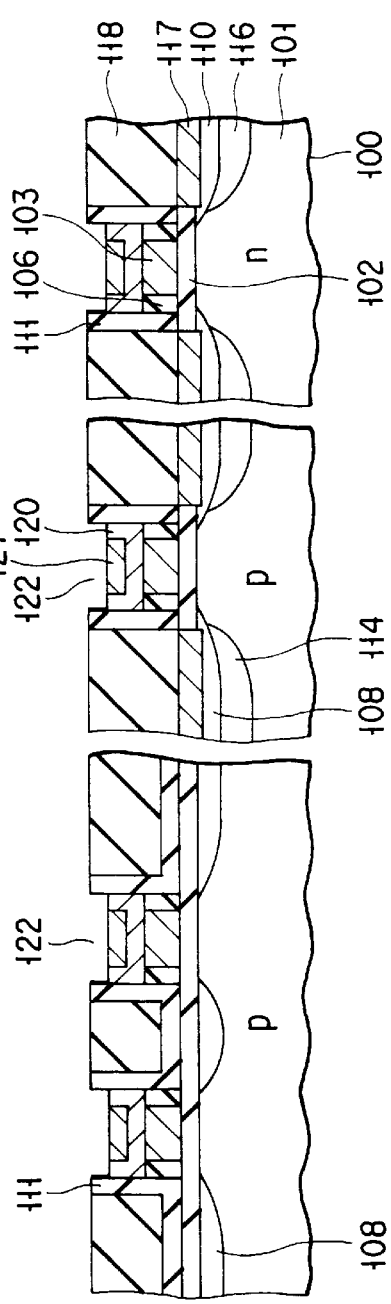

Next, as shown in FIG. 5C, the metal layer 121 and the barrier metal layer 120 are etched by means of RIE or CDE, thereby forming recesses 122 in positions where the electrode portions are located.

Figure 6A:
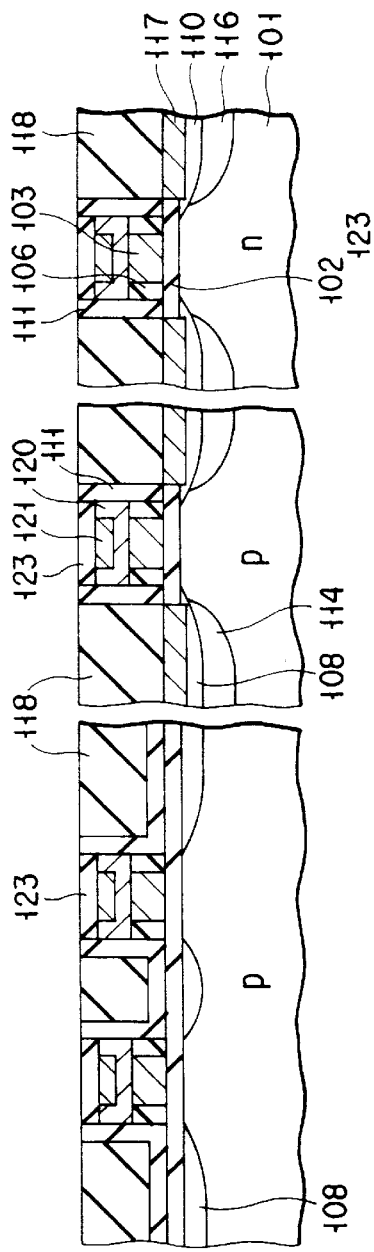
FIGS. 6A to 6C are sectional views of the semiconductor device in the order of manufacturing steps following the manufacturing steps in FIGS. 5A to 5C.

Next, as shown in FIG. 6A, a silicon nitride layer 123 is deposited over the entire surface to fill in the recesses 122 and then polished by means of CMP until the silicon oxide layer 118 is exposed, thereby providing surface planarization.

Figure 6B:
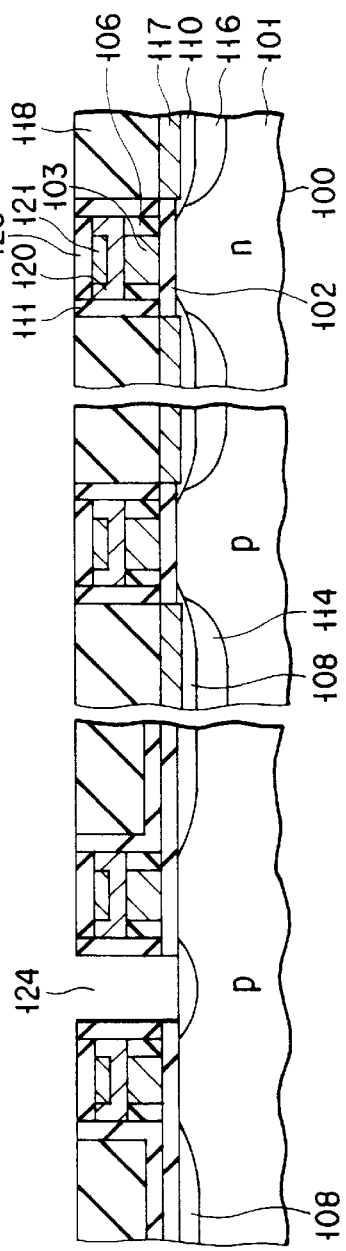

Next, as shown in FIG. 6B, using a predetermined contact pattern, the silicon oxide layer 118 is etched by means of RIE under etching conditions of high selectivity to the silicon nitride layers 111 and 123 to define openings. The silicon nitride layer 111 and the gate oxide layer 102 at the bottom of the openings are further etched away to form contact holes 124 adjacent to gate electrodes.

Note that, in case of using conventional techniques, the openings would be formed by etching the silicon oxide layer 118 without forming the silicon nitride layer 111 at the bottom of the openings; thus, the first n-type diffused layers 108 might be subjected to overetching. In this embodiment, however, the silicon oxide layer 118 is etched under the etching conditions of high selectivity to the silicon nitride layer 111 that has been formed at the bottom of openings and then only the silicon nitride layer 111 and the gate oxide layer 102 are etched, thus preventing the first n-type diffused layers 108 from being overetched.

In addition, in forming the contact holes 124, the silicon oxide layer 118 is etched under the etching conditions of high selectivity to the silicon oxide layers 111 and 123 that cover the gate electrodes, allowing self-aligned contact holes 124 to be formed.

Figure 6C:
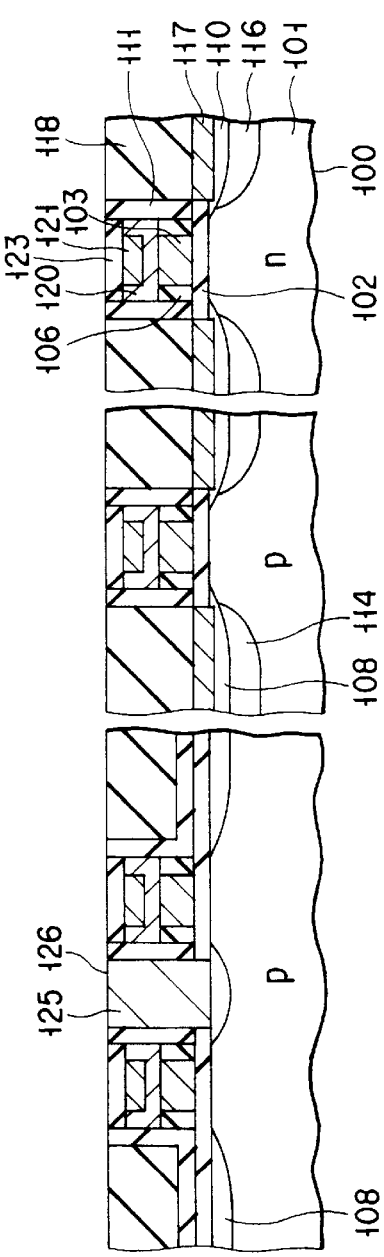

Next, as shown in FIG. 6C, a polysilicon layer 125 doped with n-type impurities is deposited over the entire surface to fill in the contact holes 124 and then polished by means of CMP until the silicon oxide layer 118 and the silicon nitride layer 123 are exposed, thereby making the surface smooth and forming self-aligned contacts (SAC) 126.

According to such a method, since silicide is not formed on silicon oxide nor silicon nitride, the silicide layer 117 is not formed on the first n-type diffused regions 108 of the memory cells. Thus, a structure can be realized easily in which silicide is existent on the first n-type diffused layers 108 of the MOSFETs in the logic section but not on the diffused regions of the transistors in the memory section.

As a consequence, in the logic section, the sheet resistance of the diffused regions can be lowered, thus improving characteristics of the MOSFETs. In the memory section, on the other hand, the junction leakage caused by silicide can be avoided.

Moreover, in forming the contact holes 124 adjacent to the gate electrodes, the silicon oxide layer 118 is etched under the etching conditions of high selectivity to the silicon nitride layers 111 and 123, thus preventing overetching of the first n-type diffused layers 108 of the MOSFETs in the memory section. In the subsequent process of burying the polysilicon layer 125 in the contact holes, the first n-type diffused layers 108 can be protected from being shorted to the p-type silicon substrate 100.

In the logic nMOSFET and the logic pMOSFET of the final structure located in the right-hand portion of FIG. 6C, the first n-type diffused layer 108 and the first p-type diffused layer 110 are each formed to self-align to the corresponding gate electrode formed on sidewall with the silicon oxide layer 106. Also, the second n-type diffused layer 114 and the second p-type diffused layer 116, which are formed deeper and more heavily doped than the first diffused layers 108 and 110, are each formed to self-align to the corresponding silicon nitride layer 111 formed on the sidewall of the silicon oxide layer 106. Therefore, in forming the second n-type diffused layer 114 and the second p-type diffused layer 110 by the ion implantation and the subsequent thermal process, the amount of expansion of the second diffused layers due to thermal diffusion is smaller than that of the first diffused layers 108 and 110. In addition, unlike the usual LDD (lightly doped drain) structure, in this structure, the silicon oxide layer 118 is formed, as an insulating layer, at the side of the polysilicon layer 103 forming the gate electrode in addition to the sidewall insulating layer 111 consisting of silicon nitride; thus, the amount of overlap between the source/drain diffusion layers and the polysilicon layer 103 is reduced, which, in cooperation with low relative permittivity of silicon oxide, reduces the low gate-to-source (or gate-to-drain) parasitic capacitance. Improvements are therefore produced in characteristics, particularly high-frequency characteristics. Moreover, in the gate electrode, the upper metal layer 121 is larger in gate length than the lower polysilicon layer 103; this helps reduce the gate resistance.

In the manufacturing method described above, the metal layer 121 that forms part of the gate electrode and is made of a metal of poor acid resistance, such as tungsten (W), is formed after the formation of the silicide layer 117 on the source/drain regions. Thus, since the metal layer 121 is covered with the silicon nitride layer 123 as a cap insulating layer immediately after the deposition thereof without being submerged in chemicals to remove the resist used for ion implantation or the unreacted titanium (Ti) after the formation of silicide, MOSFETs with a metal gate electrode can be formed with good yield and improved reliability.

[Second Embodiment]

FIGS. 7A to 7C, 8A to 8C, 9A to 9C, 10A to 10C, 11A and 11B are sectional views, in the order of steps of manufacture, of a semiconductor device in accordance with a second embodiment of the present invention. In this embodiment as well, the semiconductor device to be manufactured has a memory section and a logic section built in, and the memory section has only n-channel transistors formed in and the logic section has logic nMOSFETs and logic pMOSFETs formed in.

First, as shown in FIG. 7A, a gate oxide layer 202 is formed on a p-type silicon substrate 200 formed with an n-well region 201. A polysilicon layer 203 doped with n-type impurities is then deposited over the entire surface. An oxidation operation is then performed, so that a silicon oxide layer 204 is formed on the polysilicon layer 203. A polysilicon layer 205 is then deposited over the entire surface. The upper polysilicon layer 205 is used as a dummy layer.

Next, as shown in FIG. 7B, using standard lithographic and RIE techniques, the multilayered structure composed of the layers 203, 204, and 205 are patterned to form gate electrode portions. An oxidation operation is then carried out to recover from RIE-induced damage, so that a silicon oxide layer 206 is formed on the exposed surface of each gate electrode portion.

Next, as shown in FIG. 7C, the logic pMOSFETs are covered with a resist layer 207. Using this resist layer and the gate electrode pattern as a mask, n-type impurities, such as P or As, are ion-implanted into the substrate 200 and then a thermal process is performed to form first n-type diffused layers 208 of the memory cells and the logic nMOSFETs. In this case, the dose of ions and the ion energy gained by acceleration remain unchanged from those in the process of FIG. 2C in the first embodiment.

Next, as shown in FIG. 8A, the memory cells and the logic nMOSFETs are covered with a resist layer 209. Using this resist layer and the gate electrode pattern as a mask, p-type impurities, such as B or $BF_2$, are ion-implanted into the n-well region 201 to form first p-type diffused layers 210 of the logic pMOSFETs.

Next, as shown in FIG. 8B, a silicon nitride layer 211 is deposited over the entire surface. A resist layer 212 is then formed over the memory cells and the logic pMOSFETs. The silicon nitride layer 211 above the logic nMOSFETs are etched back by means of RIE to form a sidewall spacer 211 consisting of silicon nitride on the sidewall of each of the gate electrode portions associated with the logic nMOSFETs. After that, using the resist layer 212 and the gate electrodes formed with the sidewall spacer consisting of silicon nitride as a mask, n-type impurities, such as P or As, are ion-implanted into the substrate 200 to form second n-type diffused layers 213 which are deeper than the first n-type diffused layers 208 of the logic nMOSFETs. In this case, the implant dose and the ion energy are the same as those in the process of FIG. 3C in the first embodiment.

Next, as shown in FIG. 8C, a resist layer 214 is formed over the memory cells and the logic nMOSFETs, then the silicon nitride layer 211 above the logic pMOSFETs are etched back by means of RIE to leave the silicon nitride layer 211 as a sidewall spacer on the sidewalls of the gate electrodes of the logic pMOSFETs. After that, using the resist layer 214 and the gate electrodes formed with the sidewall spacer 211 consisting of silicon nitride as a mask, p-type impurities, such as B or $BF_2$, are ion-implanted into the n-well region 201 to form second p-type diffused layers 215 which are deeper than the first p-type diffused layers 210 of the logic pMOSFETs. In this case, the implant dose and the ion energy are the same as those in the process of FIG. 4A in the first embodiment.

The activation of impurities in the thermal process subsequent to the ion implantation allows the first n-type diffused layers 208 and the second n-type diffused layers 213 to form the source/drain regions of the logic nMOSFETs. Likewise, the first p-type diffused layers 210 and the second p-type diffused layers 215 form the source/drain regions of the logic nMOSFETs.

Figure 9A:
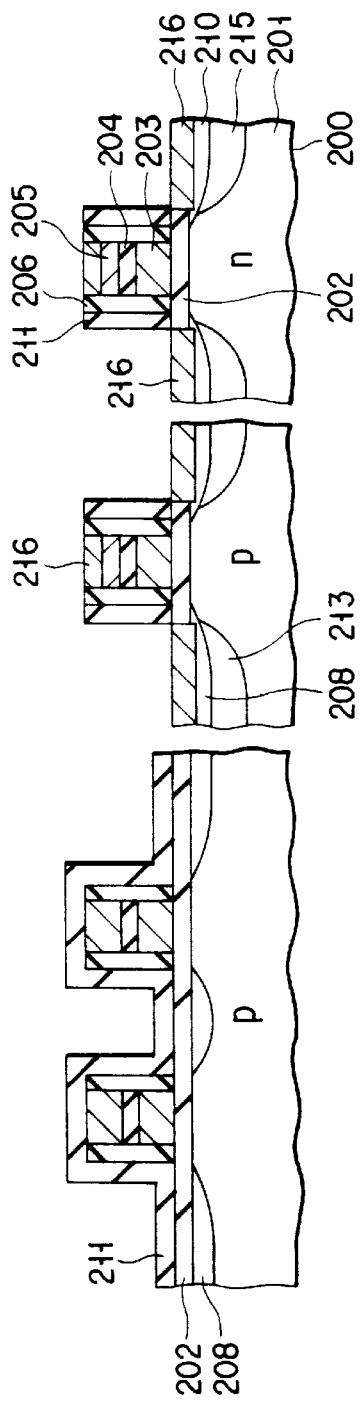
FIGS. 9A to 9C are sectional views of the semiconductor device in the order of manufacturing steps following the manufacturing steps in FIGS. 8A to 8C.

Next, as shown in FIG. 9A, after the removal of the gate oxide layer 202, titanium (Ti) is deposited by means of sputtering, then a thermal process is carried out to cause titanium to react with the source/drain regions of the logic nMOSFETs (the first n-type diffused layers 208 and the second n-type diffused layers 213), the source/drain regions of the logic pMOSFETs (the first p-type diffused layers 210 and the second p-type diffused layers 215), and the polysilicon layer 205, thereby forming a layer of $TiS_2$. Subsequently, a wet process is carried out to remove unreacted Ti using HF, so that silicide is selectively formed. At this point, no silicide is formed on the first n-type diffused layers 208 of the memory cells over which the silicon nitride layer 211 is left because silicide cannot be formed on either of silicon oxide and silicon nitride.

Figure 9B:
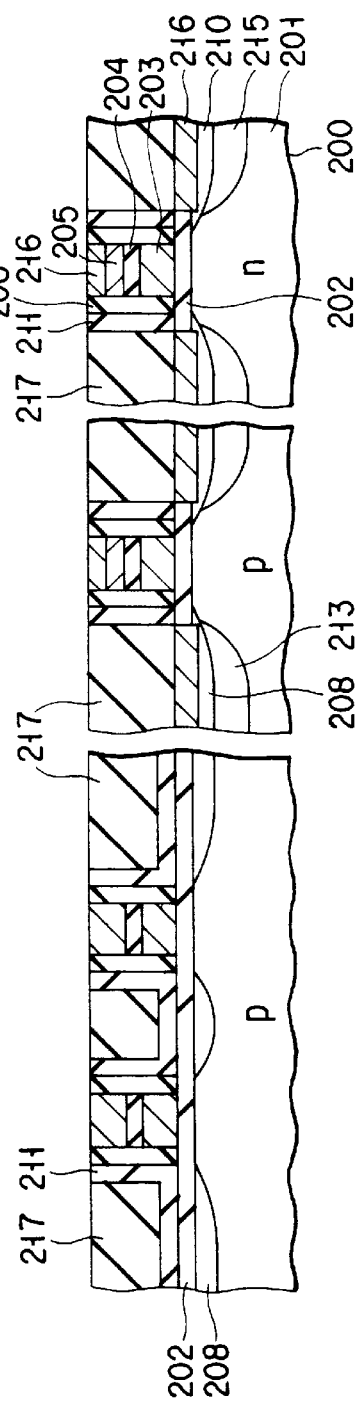

Next, as shown in FIG. 9B, a silicon oxide layer 217 is deposited over the entire surface and then polished by means of CMP until the gate electrode pattern is exposed, thereby smoothing out the entire surface.

Figure 9C:
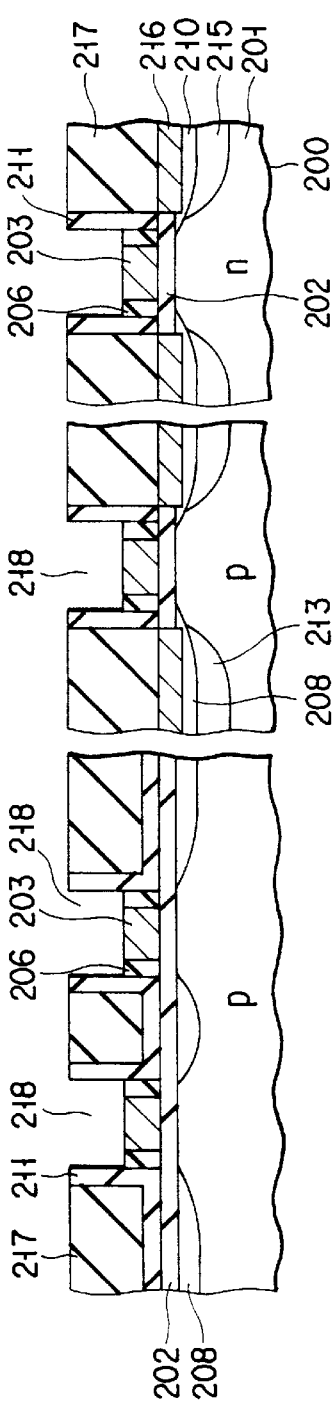

Next, as shown in FIG. 9C, using RIE or CDE, the silicide 216 and the polysilicon layer 205 in the gate electrode portions are etched away. The silicon oxide layers 204 and 206 are etched by a wet process using HF or the like to form a recess 218 in each gate electrode portion.

Figures 10A, 10B, 10C:
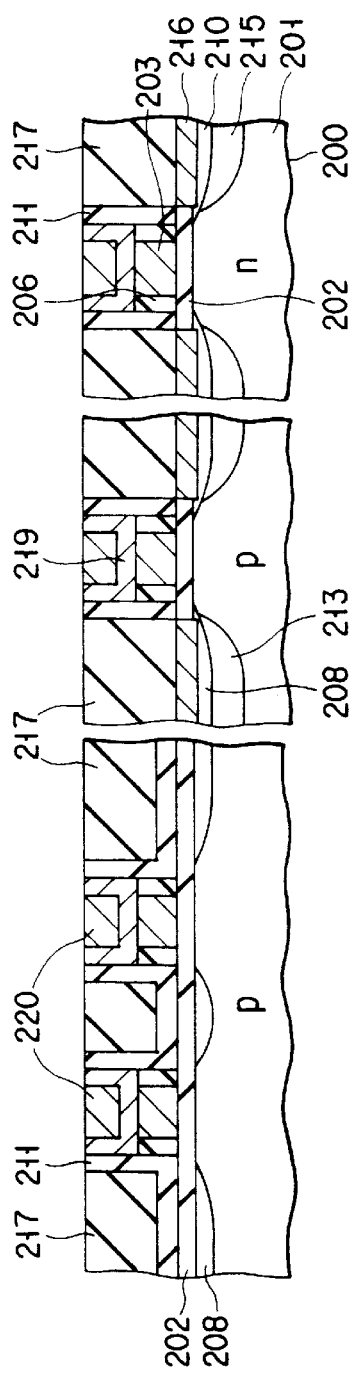
FIGS. 10A to 10C are sectional views of the semiconductor device in the order of manufacturing steps following the manufacturing steps in FIGS. 9A to 9C.

Next, as shown in FIG. 10A, a layer 219 of barrier metal, such as TiN or WN, is deposited over the entire surface by means of sputtering or CVD at such a thickness as not to fill in the recess 218, then a layer of metal 220, preferably a layer of refractory metal, such as W, is deposited over the entire surface by means of sputtering or CVD so as to fill in the recess 218. After that, the metal layer 220 and the barrier metal layer 219 are polished by CMP to smooth out the entire surface.

Next, as shown in FIG. 10B, the metal layer 220 and the barrier metal layer 219 in each gate electrode portion are etched by means of RIE or CDE to form a recess 221 in each gate electrode portion.

Next, as shown in FIG. 10C, a layer 222 of silicon nitride is deposited over the entire surface to fill in the recess 221 and then polished by means of CMP until the silicon oxide layer 217 is exposed to thereby smooth out the entire surface.

Next, as shown in FIG. 11A, using a predetermined contact pattern, the silicon oxide layer 217 is etched by means of RIE under the etching conditions of high selectivity to the silicon nitride layers 211 and 222, thereby defining openings. Further, the silicon nitride layer 211 and the gate oxide layer 202 at the bottom of the resulting openings are etched away to form contact holes 223 adjacent to the gate electrodes.

Next, as shown in FIG. 11B, an n-type doped polysilicon layer 224 is deposited over the entire surface to fill in the contact holes 223 and then polished by means of CMP until the silicon oxide layer 217 and the silicon nitride layer 222 are exposed. Thus, the entire surface becomes smoothed out and SACs 225 are formed.

Even with such a manufacturing method as described above, the silicide layer 216 is not formed on the first n-type diffused layers 208 of the memory cell MOSFETs because silicide cannot be formed on silicon oxide nor silicon nitride. Accordingly, a structure can be realized easily in which silicide is existent on the diffused layers of the logic MOSFETs but it is non-existent on the diffused layers of the memory cell transistors.

As a result, in the logic section the sheet resistance of the diffused layers can be lowered to improve the characteristics of MOSFETs and, in the memory section, the junction leakage caused by silicide can be avoided.

In addition, since the silicon oxide layer 217 is etched under the etch conditions of high selectivity to the silicon nitride layers 211 and 222 in order to form the contact holes 223, overetching of the first n-type diffused layers 208 of the MOSFETs in the memory section can be prevented, which, in turn, prevents the first n-type diffused layers 208 from being shorted to the p-type silicon semiconductor substrate 200 when the contact holes 223 are later filled with the polysilicon layer 224.

Moreover, in comparison with the first embodiment, the second embodiment requires fewer processes. That is, the first embodiment requires three processes: the process of FIG. 3B in which the silicon nitride layer 111 is deposited over the entire surface, the resist layer 112 is formed over the memory section, and using RIE, etchback is performed to leave sidewall spacers 111 consisting of silicon nitride on the sidewalls of the gate electrode portions of the logic nMOSFETs and the logic pMOSFETs; the process of FIG. 3C in which the resist layer 113 is formed over the memory cells and the logic pMOSFETs and the second n-type diffused layers 114 of the logic nMOSFETs are formed; and the process of FIG. 4A in which the resist layer 115 is formed over the memory cells and the logic nMOSFETs and the second p-type diffused layers 116 of the logic pMOSFETs are formed. On the other hand, the second embodiment requires two processes: the process of FIG. 8B in which the silicon nitride layer 211 is formed over the entire surface, the resist layer 212 is formed over the memory cells and the logic pMOSFETs, etchback is performed using RIE to leave sidewall spacers 211 consisting of silicon nitride on the sidewalls of the gate electrode portions of the logic nMOSFETs, and the second n-type diffused layers of the logic nMOSFETs are formed; and the process of FIG. 8C in which the resist layer 214 is formed over the memory cells and the logic nMOSFETs, etchback is performed using RIE to leave sidewall spacers 211 consisting of silicon nitride on the sidewalls of the gate electrode portions of the logic pMOSFETs, and the second p-type diffused layers of the logic pMOSFETs are formed.

Thus, in comparison with the first embodiment, the second embodiment produces an advantage that the number of lithographic steps is reduced by one.

In the final structure of the semiconductor device fabricated in accordance with the method of the second embodiment, the first n-type diffused layer 208 of the logic nMOSFET and the first p-type diffused layer 210 of the logic PMOSFET, which are located in the right-hand portion of FIG. 11B, are each formed to self-align to the corresponding gate electrode formed on sidewall with the silicon oxide layer 206. In addition, the second n-type diffused layer 213 and the second p-type diffused layer 215, which are respectively formed deeper and more heavily doped than the first n-type diffused layer 208 and the first p-type diffused layer 210, are each formed to self-align to the corresponding silicon nitride layer 211 as a sidewall insulating layer formed on the silicon oxide layer 206. Thus, in forming the second n-type diffused layer 213 and the second p-type diffused layer 215, which are heavily doped, by the ion implantation and the subsequent thermal process, the amount of expansion of the diffused layers due to thermal diffusion is reduced as compared with that of the first n-type and p-type diffused layers 208 and 210. Moreover, as in the first embodiment, the silicon oxide layer 217 as an insulating film is formed at the side of the polysilicon layer 203; thus, the amount of overlap between the source/drain diffusion layers and the polysilicon layer 203 is reduced, which, in cooperation with low relative permittivity of silicon oxide, reduces the low gate-to-source (or gate-to-drain) parasitic capacitance. Improvements are therefore produced in characteristics, particularly high-frequency characteristics. Furthermore, as in the first embodiment, the gate resistance can be reduced and MOSFETs with metal gate electrodes can be formed with good yield.

Although the preferred embodiments of the present invention have been disclosed and described, it is apparent that other embodiments and modifications are possible. That is, although the embodiments have been described in terms of a semiconductor device having a memory section and a logic unit built in the same chip, the present invention may be practiced on a semiconductor device which, like memory cells and peripheral circuitry, includes some MISFETs that require the formation of silicide on their source/drain diffused layers and other MISFETs that have no silicide formation requirement. Further, the present invention may be practiced on all types of semiconductor devices that include MISFETs.

As described thus far, according to the present invention, in fabricating a semiconductor device having, for example, a logic section and a memory section built in the same chip, a structure can be obtained in which silicide is selectively formed only on the diffused regions of some MISFETs and no silicide is existent on the diffused regions of others. Thus, a semiconductor device and a method of manufacture thereof can be provided which allow some MISFETs to be improved in characteristics without degrading the characteristics of others.

In addition, according to the present invention, there are provided a semiconductor device which is low in gate resistance and small in parasitic gate-to-source/drain capacitance and a semiconductor device manufacturing method which permits MISFETs each having a metal gate electrode to be formed with good yield and reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor device comprising:
  a semiconductor substrate;
  a gate insulating layer formed on the semiconductor substrate;
  a gate electrode formed on the gate insulating layer and including a lower electrode made of a first conductive layer and an upper electrode made of a second conductive layer lower in resistance than the first conductive layer;

a first insulating layer selectively formed on a sidewall of the lower electrode of the gate electrode;

a second insulating layer formed on a sidewall of the upper electrode and the first insulating layer covering the lower electrode of the gate electrode; and first and second MISFETs formed in the semiconductor substrate and each having source/drain region, wherein the first MISFET has no silicide formed on its source/drain region and the second MISFET has silicide formed on its source/drain region.

2. The semiconductor device according to claim 1, wherein a source/drain region of the first MISFET does not have a deeper diffused layer, and a source/drain region of the second MISFET has a shallower diffused layer and a deeper diffused layer.

3. The semiconductor device according to claim 1, wherein the first MISFET is a transistor of a memory cell and the second MISFET is a peripheral transistor.

4. The semiconductor device according to claim 1, wherein the second conductive layer is made of a refractory metal.

5. The semiconductor device according to claim 1, wherein the first insulating layer is made of silicon oxide and the second insulating layer is made of silicon nitride.

6. A semiconductor device comprising:

a semiconductor substrate;

a gate insulating layer formed on the semiconductor substrate;

a gate electrode formed on the gate insulating layer;

a first insulating layer formed on a sidewall of the gate electrode;

a second insulating layer formed on the first insulating layer; and first, second and third MISFETs formed in the semiconductor substrate and each having source/drain region, wherein the first MISFET has no silicide formed on its source/drain region and the second and third MISFETs have silicide formed on their source/drain regions.

7. The semiconductor device according to claim 6, wherein a source/drain region of the first MISFET does not have a deeper diffused layer, and a source/drain region of the second MISFET has a shallower diffused layer and a deeper diffused layer.

8. The semiconductor device according to claim 6, wherein the first MISFET is of n-channel type and the second and third MISFETs each are of p-channel type.

9. The semiconductor device according to claim 6, wherein the first MISFET is a memory cell and the second and third MISFETs are peripheral transistors.

10. The semiconductor device according to claim 6, wherein the first insulating layer is made of silicon oxide and the second insulating layer is made of silicon nitride.

11. A semiconductor device comprising:

a semiconductor substrate;

a gate insulating layer formed on the semiconductor substrate;

a gate electrode formed on the gate insulating layer and including a lower electrode made of a first conductive layer and an upper electrode made of a second conductive layer lower in resistance than the first conductive layer;

a first insulating layer selectively formed on a sidewall of the lower electrode of the gate electrode;

a second insulating layer formed on a sidewall of the upper electrode and the first insulating layer covering the lower electrode of the gate electrode;

first, second and third MISFETs formed in the semiconductor substrate and each having source/drain region, wherein the first MISFET has no silicide formed on its source/drain region and the second and third MISFETs have silicide formed on their source/drain regions.

12. The semiconductor device according to claim 11, wherein the first MISFET has no LDD structure in its source/drain regions, and the second and third MISFETs each have an LDD structure in their source/drain regions.

13. The semiconductor device according to claim 11, wherein the first and second MISFETs are of n-channel type and the third MISFETs is of p-channel type.

14. The semiconductor device according to claim 11, wherein the first MISFET is a memory cell transistor and the second and third MISFETs are peripheral transistors.

15. The semiconductor device according to claim 11, wherein the second conductive layer is made of a refractory metal.

16. The semiconductor device according to claim 11, wherein the first insulating layer is made of silicon oxide and the second insulating layer is made of silicon nitride.

* * * * *